United States Patent [19]

Nakai

[11] Patent Number: 5,293,267

[45] Date of Patent: Mar. 8, 1994

[54] SOLID-STATE IMAGING DEVICE

[75] Inventor: Junichi Nakai, Fukuyama, Japan

[73] Assignee: Sharp Kabushiki Kaisha, Osaka, Japan

[21] Appl. No.: 843,891

[22] Filed: Feb. 27, 1992

[30] Foreign Application Priority Data

Jul. 15, 1991 [JP] Japan ................... 3-174167

[51] Int. Cl.⁵ ............... G02B 27/00; H01L 31/0232
[52] U.S. Cl. .................. 359/619; 359/620; 359/741
[58] Field of Search .......... 359/741, 619, 620–624, 359/565; 264/1.4, 1.7, 2.7; 430/321–324, 330

[56] References Cited

U.S. PATENT DOCUMENTS 4,877,717 10/1989 Suzuki et al. ............... 359/619

FOREIGN PATENT DOCUMENTS

| 0124025 | 11/1984 | European Pat. Off. |
| 0242663 | 10/1987 | European Pat. Off. |
| 60-038989 | 2/1985 | Japan . |
| 60-060757 | 4/1985 | Japan . |
| 61-290403 | 12/1986 | Japan .................... 359/619 |
| 1309370 | 12/1989 | Japan . |
| 3-148173 | 6/1991 | Japan . |
| 4-12568 | 1/1992 | Japan . |

OTHER PUBLICATIONS

Patent Abstracts of Japan, vol. 8, No. 206, Sep. 20, 1984 & JP-A 59-90466 (Mitsubishi Denki KK) May 24, 1984.

Primary Examiner—Scott J. Sugarman
Assistant Examiner—James Phan
Attorney, Agent, or Firm—David G. Conlin; George W. Neuner

[57] ABSTRACT

In a solid-state imaging device having a microlens above a light receiving section formed on a substrate, the microlens comprises a first lens layer formed on a smooth surface of the substrate and a second lens layer formed on the first lens layer. In a transverse direction, the second lens layer is extended down on both sides of the first lens layer to be in contact with the substrate. In a longitudinal direction, the second lens layer is kept on a top surface of the substrate. The second lens layer is subjected to softening treatment.

7 Claims, 5 Drawing Sheets

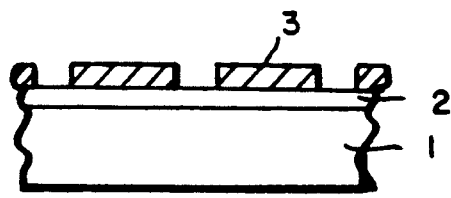
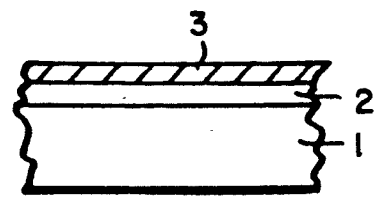
FIG. 3a          FIG. 3b
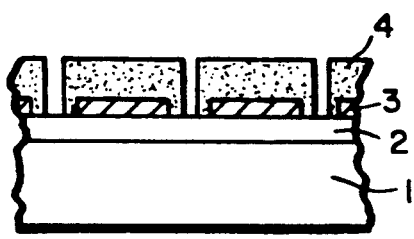
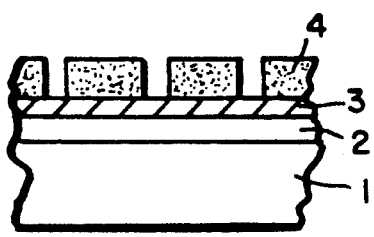
FIG. 4a          FIG. 4b
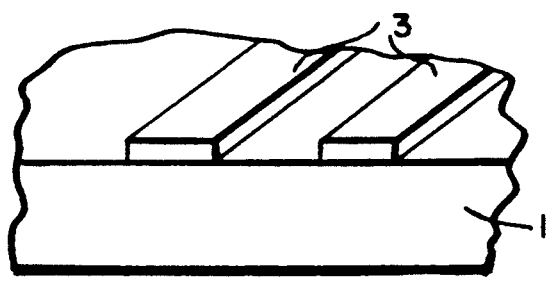
FIG. 5
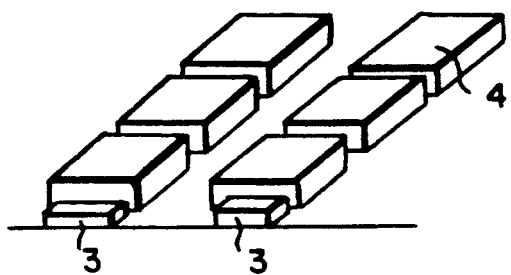
FIG. 6

SOLID-STATE IMAGING DEVICE

BACKGROUND OF THE INVENTION

1. Field of the Invention

The present invention relates to a solid-state imaging device integratedly having a microlens formed of a transparent resin or the like for the use of an image input device such as a movie camera device, a still camera, a facsimile machine and a wordprocessor.

2. Description of the Prior Art

FIG. 8 shows a known solid-state imaging device. This solid-state imaging device comprises a substrate 11, photodiodes 12, ... as pixels formed in a top portion of the substrate 11, and microlenses 13, ... formed of a transparent resin above the photodiodes 12, ... A light is converged on the photodiode 12 through the microlens 13, whereby a photosensitivity of the device is improved. The reference numerals 16, ... denote registers constituting CCDs (charge coupled devices), and a shaded portion indicated by the reference numeral 17 denotes a smoothing layer for smoothing a top surface of the substrate 11, which is rugged because of the photodiodes 12, ..., the registers 16, ... and the like formed thereon.

As the above microlens 13, a strip-shaped microlens 14 (FIG. 9a) and a rectangular microlens 15 (FIG. 9b) are well known. These microlenses 14 and 15 are each formed in the following way. First, as shown in FIGS. 10a and 10b, a lengthy strip pattern 14a or a rectangular pattern 15a is formed of a resin or a resist on the substrate 11 by photo-etching or the like, after the rugged top surface of the substrate 11 due to the photodiode, the register and the like is smoothed by the smoothing layer. Then, the lengthy strip pattern 14a or the rectangular pattern 15a is softened by heating or the like to make a convex curved surface by surface tension.

As illustrated in FIG. 11, an arranged pitch of the microlenses 15 is determined in accordance with the positional relationship between the microlenses 15 and the corresponding photodiodes 12. For improving the photosensitivity of the solid-state imaging device, a microlens should be made rectangular in order to have the largest possible area and the smallest possible gaps from the adjacent microlenses. Additionally, in the case of the rectangular microlens 15 having a curvature over all the directions of an upper surface thereof, the light incident from all the directions can be converged. In the case of the strip-shaped microlens 14, however, only a portion of the light incident from all the directions can be converged due to the shape thereof, resulting in a slightly lower photosensitivity than that of the rectangular microlens 15.

As shown in FIGS. 11 and 12, the rectangular microlens 15 has different widths in a longitudinal direction ("a" direction) and in a transverse direction ("b" direction) although having the same height H. Accordingly, the microlens 15 has different curvatures in the "a" and the "b" directions. In the case that the width W in the "a" direction is larger than the width W in the "b" direction, if the width W in the "a" direction is suitable to obtain a good light convergence (FIG. 13a), the width W in the "b" direction is short enough to obtain a poor light convergence (FIG. 13b). In consequence, the light convergence and the photosensitivity cannot be enhanced to a sufficiently high level in the conventional solid-state imaging device.

SUMMARY OF THE INVENTION

The solid-state imaging device of this invention for converging a light on a light receiving section formed on a substrate which overcomes the above-discussed and numerous other disadvantages and deficiencies of the prior art comprises a microlens disposed above a light receiving section on a substrate, the microlens comprising a first lens layer and a second lens layer formed on the first lens layer, wherein at least the second lens layer is subjected to softening treatment.

In a preferred embodiment of the invention, the first lens layer and the second lens layer may each be formed of a material having a high photosensitivity and a high transparency.

In a preferred embodiment of the invention, the material of the first lens layer may be selected from the group consisting of acrylic resin, novolac resin, polystyrene and epoxy resin.

In a preferred embodiment of the invention, the material of the second lens layer may be selected from the group consisting of acrylic resin, novolac resin, polystyrene and epoxy resin.

In a preferred embodiment of the invention, the second lens layer may be formed on the first lens layer in islands.

In a preferred embodiment of the invention, the second lens layer may be extended to be in contact with the substrate in a transverse direction of the first lens layer before being subjected to the softening treatment.

Thus, the invention described herein makes possible the objective of providing a solid-state imaging device for further improving the light convergence and thus the photosensitivity.

BRIEF DESCRIPTION OF THE DRAWINGS

This invention may be better understood and its numerous objects and advantages will become apparent to those skilled in art by reference to the accompanying drawings as follows:

FIGS. 2a, 3a and 4a are front views illustrating a production procedure of the above solid-state imaging device, and FIGS. 2b, 3b and 4b are side views illustrating the same.

FIG. 5 is a perspective view of a first lens layer 3 formed on a substrate 1.

FIG. 6 is a perspective view of a second lens layer 4 formed on the first lens layer 3.

FIG. 7 is a view illustrating the light convergence of the above solid-state imaging device shown in FIG. 1a.

DESCRIPTION OF THE PREFERRED EMBODIMENTS

The present invention will be described by way of illustrating embodiments with reference to the accompanying drawings.

Figure 1A:
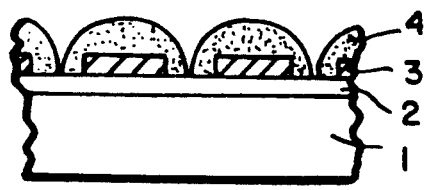
FIG. 1a is a front view of a solid-state imaging device of the present invention.
Figure 1B:
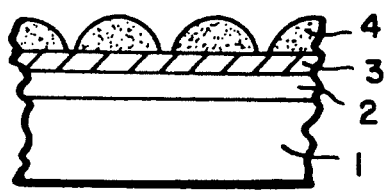
FIG. 1b is a side view thereof.

FIG. 1a is a front view of a solid-state imaging device of the present invention, and FIG. 1b is a side view thereof. The solid-state imaging device comprises a substrate 1, a smoothing layer 2 formed on the substrate 1, a first lens layer 3 formed on the smoothing layer 2, and a second lens layer 4 formed on the first lens layer 3. A top surface of the substrate 1 is rugged due to a photodiode, a register, and the like (not shown) formed thereon, but is smoothed by the smoothing layer 2.

The first and the second lens layers 3 and 4 are both formed of the same transparent resin. A microlens, which is formed of an overlapping portion of the first and the second lens layers 3 and 4, is located above the photodiode, thereby converging a light on the photodiode.

Figure 2A:
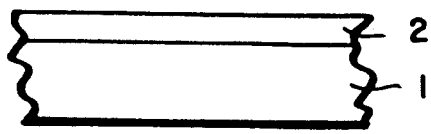
Figure 2B:
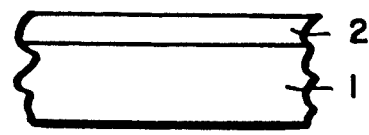

Such a solid-state imaging device is manufactured in the following way. First, the photodiode, the register and the like are formed on the substrate 1, and then the smoothing layer 2 is formed on the rugged top surface of the substrate 1 as shown in FIGS. 2a and 2b. If necessary, a color filter may be formed on the smoothing layer 2, which may further be covered with a protective film.

Thereafter, the first lens layer 3 is formed on the smoothing layer 2 made of a material which has a high photosensitivity and a high transparency such as acrylic resin, novolac resin, polystyrene and epoxy resin, since the first lens layer 3 constitutes a portion of the microlens as mentioned above. The first lens layer 3 is arranged in stripes as shown in FIGS. 3a (front view) and 3b (side view) by pasting the above material all over the smoothing layer 2, exposing the material to a light selectively by the use of a photomask, and then removing unnecessary portions. Acrylic resin, novolac resin polystyrene and epoxy resin are more effective in improving the light quantity of the device than other materials such as polyimide resin.

The second lens layer 4 is formed of a material such as acrylic resin, novolac resin, polystyrene and epoxy resin, which has a high photosensitivity and a high transparency as well as being softened when heated at a high temperature and then hardened when further heated. These materials are more effective in improving the light quantity than other materials such as polyimide resin. The second lens layer 4 is arranged in islands as shown in FIGS. 4a (front view) and 4b (side view) by, for example, pasting the above material all over the smoothing layer 2, exposing the material to a light selectively by the use of a photomask, and removing unnecessary portions. In this way, the first lens layer 3 formed in stripes (FIG. 5) is superimposed by the second lens layer 4 (FIG. 6) formed in islands. The second lens layer 4 is extended down on side surfaces of the first lens layer 3 in a transverse direction thereof so as to be in contact with the smoothed surface of the substrate 1.

Thereafter, the second lens layer 4 is softened by heating so that the second lens layer 4 is in contact with the above side surfaces of the first lens layer 3 in the transverse direction (FIG. 1a) but is kept on a top surface of the first lens layer 3 in a longitudinal direction (FIG. 1b). If the second lens layer 4 is not formed so as to be extended on the side surfaces of the first lens layer 3 in the transverse direction, there is a possibility that the second lens layer 4 is not contacted with the substrate 1 by softening. In the construction of this embodiment, each stripe of the first lens layer 3 and the second lens layer 4 on the top and the side surfaces of the above stripe form a microlens. In such a microlens, each curved portion of the second lens layer 4 in a first cross section taken in a first direction is in contact with the smoothed surface of the substrate 1, and each curved portion thereof in a second cross section taken in a second direction is in contact only with the smoothed first lens layer 3. If the first lens layer 3 is softened by heating together with the second lens layer 4, it is preferred that the first lens layer 3 is slightly softened by heating or the like before the second lens layer 4 is formed.

Figure 7:
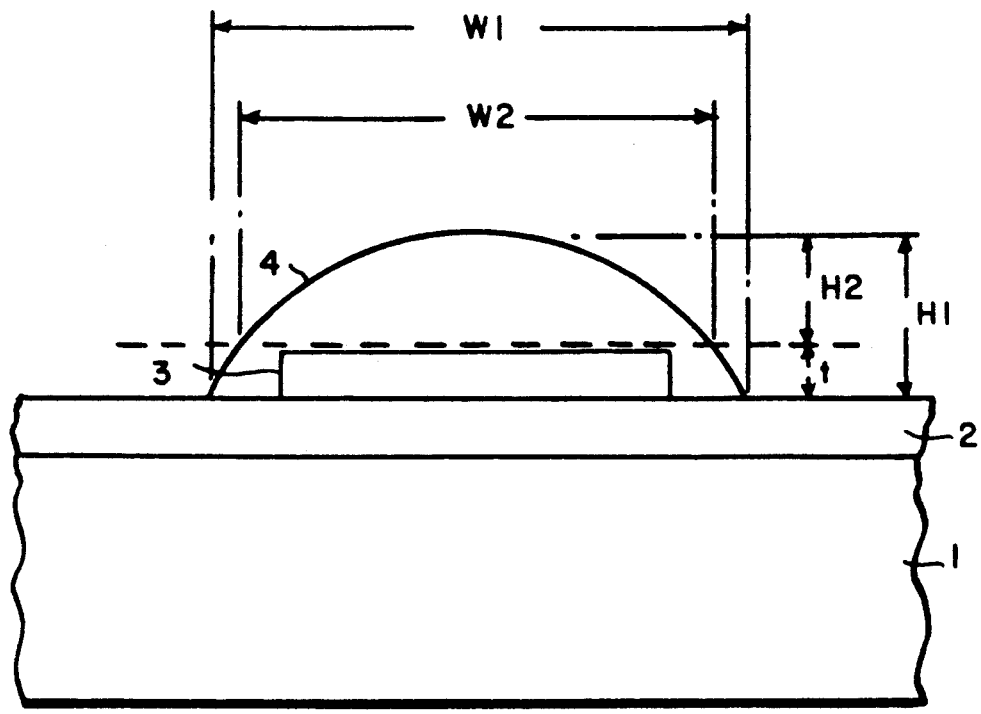
Figure 8:
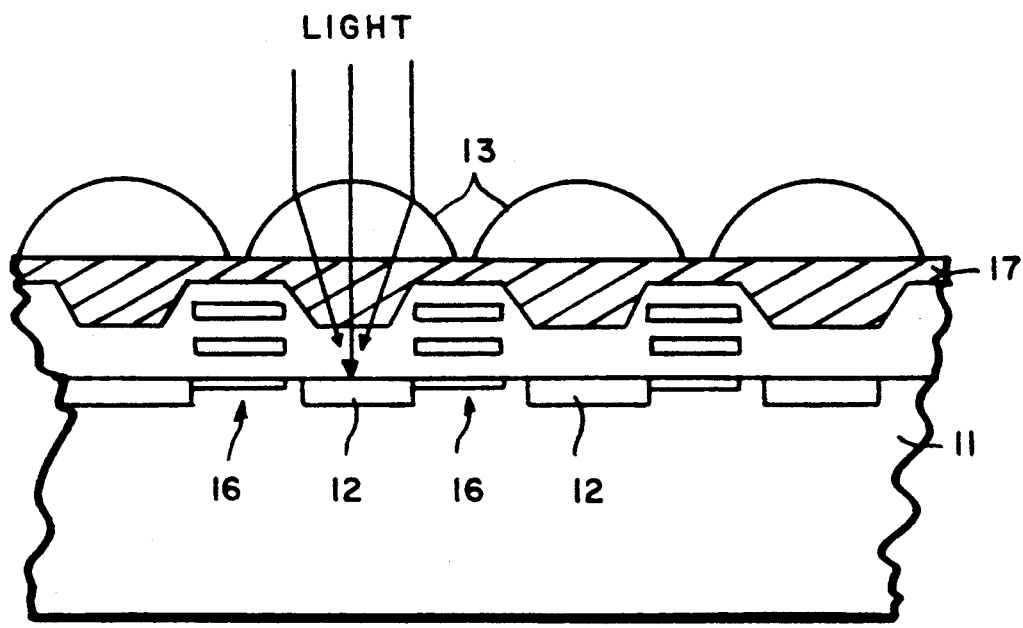
FIG. 8 is a front sectional view of a conventional solid-state imaging device.
Figure 9A:
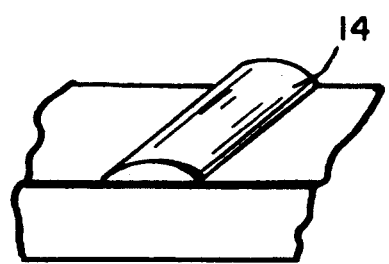
FIG. 9a is a perspective view of a conventional strip-shaped microlens.
Figure 9B:
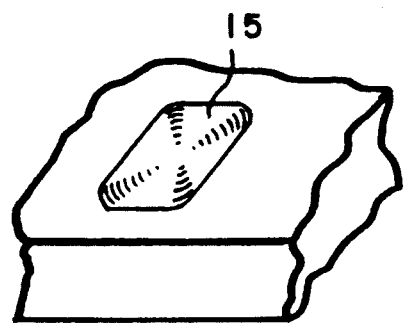
FIG. 9b is a perspective view of a conventional rectangular microlens.
Figure 10A:
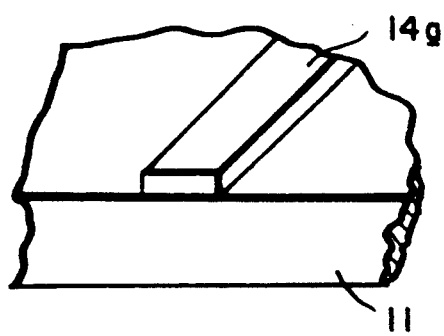
FIG. 10a is a perspective view of a step of production of the microlens shown in FIG. 9a, and FIG. 10b is a perspective view of a step of production of the microlens shown in FIG. 9b.
Figure 10B:
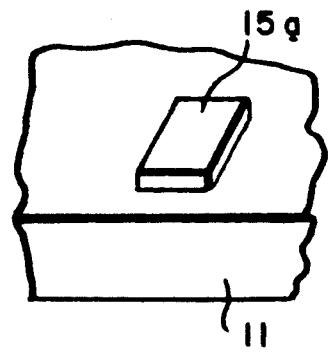
Figure 11:
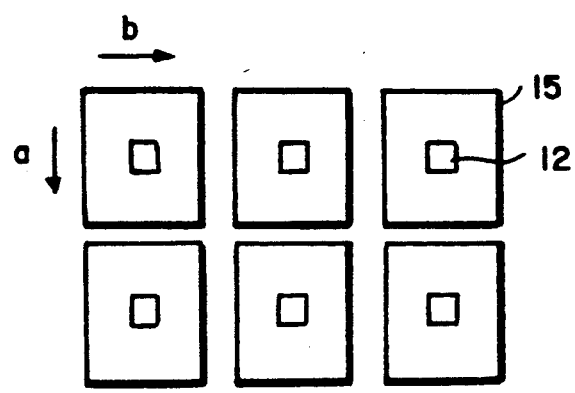
FIG. 11 is a plan view of the conventional solid-state imaging device.
Figure 12:
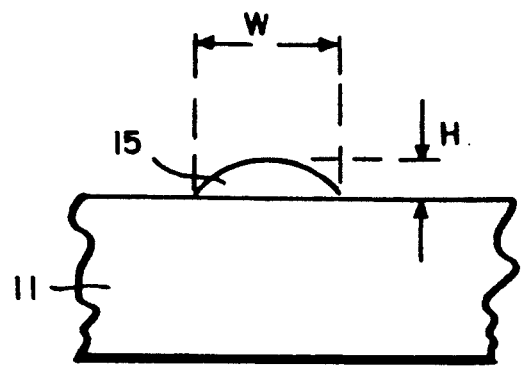
FIG. 12 is a view illustrating a curvature of a microlens.
Figure 13A:
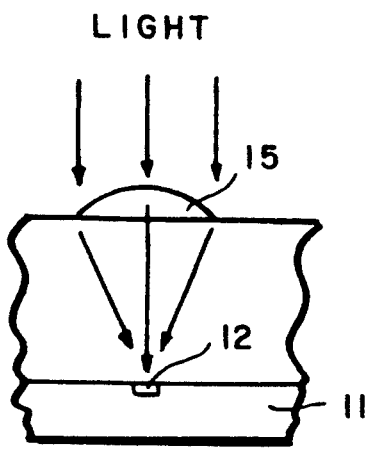
FIG. 13a is a view illustrating a good light convergence.
Figure 13B:
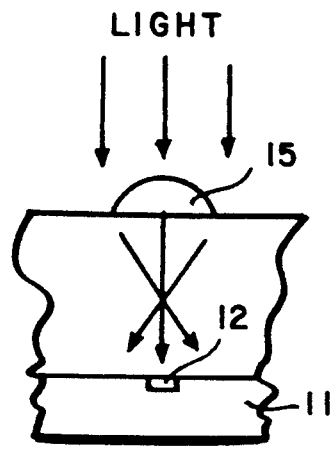
FIG. 13b is a view illustrating a poor light convergence.

In a solid-state imaging device having the above construction, the light converging state in the longitudinal and the transverse directions can be aligned as will be explained hereinafter. In FIG. 7, the height of the second lens layer 4 in the first cross section is H1. The height of the second lens layer 4 in the second cross section, namely, a portion which virtually functions as a lens in the second cross section is H2. The height H2 is adjusted by changing the thickness t of the first lens layer 3. By determining the thickness t based on the height H1, the width W1 of the first cross section and the width W2 of the second cross section, it is possible to align curves of the first and the second cross sections. In other words, it is possible to uniformize curvatures in the longitudinal and the transverse directions. Consequently, the light converging state in the two directions can be aligned, thereby providing the microlens with a sufficiently high photosensitivity. Practically, the photosensitivity can be improved by several tens of percent.

Although the second lens layer 4 is formed in islands in the above embodiment, the second lens layer 4 may be formed in stripes which are perpendicular to the stripes of the first lens layer 3.

The second lens layer 4 may be softened by irradiating microwave, infrared rays, ultraviolet rays, far ultraviolet rays or electronic beams instead of heating. In such a case, the second lens layer 4 is formed of a material which is softened by the above-mentioned irradiation, and once softened, the second lens layer 4 should be hardened again.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A solid-state imaging device provided with a plurality of microlenses disposed above a light receiving section on a substrate, the plurality of microlenses comprising a first lens layer formed in stripes and a second lens layer formed on the first lens layer in islands, wherein at least the second lens layer is subjected to softening treatment.

2. A solid-state imaging device according to claim 1, wherein the first lens layer and the second lens layer are each formed of a material having a high photosensitivity and a high transparency.

3. A solid-state imaging device according to claim 2, wherein the material of the first lens layer is selected from the group consisting of acrylic resin, novolac resin, polystyrene and epoxy resin.

4. A solid-state imaging device according to claim 2, wherein the material of the second lens layer is selected from the group consisting of acrylic resin, novolac resin, polystyrene and epoxy resin.

5. A solid-state imaging device according to claim 1, wherein the light receiving section has an array of photodiodes which are arranged in rows and columns, an arranged pitch of the columns is larger than that of the rows, and each of the stripes of the first lens layer is formed in a direction along the columns.

6. A solid-state imaging device provided with a plurality of microlenses disposed above a light receiving section on a substrate, the plurality of microlenses comprising a first lens layer formed in stripes and a second lens layer formed on the first lens layer in islands, wherein at least the second lens layer is subjected to softening treatment, wherein each of the islands of the second lens layer is extended down on side surfaces of the first lens layer in a transverse direction of each of the stripes of the first lens layer before being subjected to the softening treatment, and wherein each of the islands of the second lens layer has an outer convex curved surface which extends to the periphery of the first lens layer and the outer convex curved surface of each of the islands of the second lens layer has the same curvature in a direction along each of the stripes of the first lens layer as that in a direction perpendicular to each of the stripes of the first lens layer.

7. A solid-state imaging device provided with a plurality of microlens disposed above a light receiving section on a substrate, the plurality of microlenses comprising a first lens layer formed in stripes and a second lens layer formed on the first lens layer in islands, wherein at least the second lens layer is subjected to softening treatment, wherein each of the islands of the second lens layer is extended down on side surfaces of the first lens layer in a transverse direction of each of the stripes of the first lens layer before being subjected to the softening treatment.

* * * * *